(12) United States Patent
Kikuchi

(10) Patent No.: US 12,379,496 B2
(45) Date of Patent: Aug. 5, 2025

(54) SURVEYING DEVICE AND SURVEYING METHOD USING THE SURVEYING DEVICE

(71) Applicant: TOPCON CORPORATION, Tokyo (JP)

(72) Inventor: Takeshi Kikuchi, Tokyo (JP)

(73) Assignee: TOPCON CORPORATION, Tokyo (JP)

( * ) Notice: Subject to any disclaimer, the term of this patent is extended or adjusted under 35 U.S.C. 154(b) by 836 days.

(21) Appl. No.: 17/678,514

(22) Filed: Feb. 23, 2022

(65) Prior Publication Data

US 2022/0291379 A1 Sep. 15, 2022

(30) Foreign Application Priority Data

Mar. 15, 2021 (JP) ................. 2021-040958

(51) Int. Cl.
| | |
|---|---|
| *G01C 19/00* | (2013.01) |
| *G01P 15/18* | (2013.01) |
| *G01S 17/10* | (2020.01) |
| *G01S 19/01* | (2010.01) |
| *G06F 3/01* | (2006.01) |
| *G06F 30/13* | (2020.01) |
| *G06T 7/55* | (2017.01) |
| *G06T 19/00* | (2011.01) |

(52) U.S. Cl.
CPC .............. *G01S 17/10* (2013.01); *G01C 19/00* (2013.01); *G01P 15/18* (2013.01); *G01S 19/01* (2013.01); *G06F 3/012* (2013.01); *G06F 30/13* (2020.01); *G06T 7/55* (2017.01); *G06T 19/006* (2013.01)

(58) Field of Classification Search
CPC . G01S 17/10; G01S 19/01; G01S 5/16; G01S 11/12; G01S 17/08; G01C 19/00; G01C 15/002; G01P 15/18; G06F 3/012; G06F 30/13; G06T 7/55; G06T 19/006; G06T 7/593

See application file for complete search history.

(56) References Cited

U.S. PATENT DOCUMENTS

| | | | |
|---|---|---|---|
| 8,943,701 B2* | 2/2015 | Hayes ................. | G01C 15/002 33/1 G |
| 11,360,310 B2* | 6/2022 | Lawver .................. | G06F 3/011 |

(Continued)

*Primary Examiner* — Yaritza Guadalupe-McCall
(74) *Attorney, Agent, or Firm* — Studebaker Brackett PLLC

(57) ABSTRACT

A surveying device includes a wearable device including a posture sensor for detecting three-axis directions of a line-of-sight direction x, a left-right direction y, and an up-down direction z-axis of the worker, a distance-measuring unit for measuring a linear distance L from a distance measuring start point to a measurement point in the x-axis, and a position sensor having a fixed disposition relationship with the distance-measuring unit based on the three-axis directions, an operation unit, a disposition storage unit, and an arithmetic unit for acquiring the linear distance, position information, posture information, and the disposition relationship, calculating coordinates of the distance measuring start point by moving coordinates acquired by the position sensor in the three-axis directions based on the disposition relationship, and recognizing coordinates moved by the linear distance in the x-axis direction from the coordinates of the distance measuring start point as coordinates of the measurement point.

6 Claims, 12 Drawing Sheets

(56) References Cited

U.S. PATENT DOCUMENTS

| | | | |
|---|---|---|---|
| 11,512,956 B2* | 11/2022 | Kahle | A42B 3/0433 |
| 11,550,034 B2* | 1/2023 | Kumagai | G01S 7/4808 |
| 11,598,636 B2* | 3/2023 | Kagata | G01C 15/00 |
| 11,821,730 B2* | 11/2023 | Kahle | A42B 3/0433 |
| 11,966,508 B2* | 4/2024 | Kikuchi | G06F 3/013 |
| 12,146,741 B2* | 11/2024 | Kahle | G06T 7/73 |
| 12,152,883 B2* | 11/2024 | Kikuchi | G06F 30/13 |
| 12,175,557 B2* | 12/2024 | Lee | G01C 15/002 |
| 2009/0235541 A1 | 9/2009 | Kumagai et al. | |
| 2015/0160009 A1* | 6/2015 | Bank | G01C 15/006 33/275 R |
| 2019/0094021 A1* | 3/2019 | Singer | G01C 15/008 |
| 2021/0080255 A1* | 3/2021 | Kikuchi | G01C 15/002 |
| 2022/0276049 A1* | 9/2022 | Kikuchi | G01C 15/06 |
| 2022/0276050 A1* | 9/2022 | Kikuchi | G06V 30/228 |
| 2022/0291379 A1* | 9/2022 | Kikuchi | G06F 30/13 |
| 2023/0069309 A1* | 3/2023 | Nishi | E04G 21/16 |
| 2023/0152095 A1* | 5/2023 | Sato | G01C 15/04 116/209 |
| 2023/0168377 A1* | 6/2023 | Kikuchi | G01S 17/42 356/4.01 |
| 2025/0044085 A1* | 2/2025 | Kahle | G06F 3/013 |

\* cited by examiner

SURVEYING DEVICE AND SURVEYING METHOD USING THE SURVEYING DEVICE

TECHNICAL FIELD

The present invention relates to a surveying instrument and a surveying method, and in particular, to a wearable-type surveying device and a surveying method using the wearable-type surveying device.

BACKGROUND ART

In a survey work associated with civil engineering and construction, a worker designates a measurement point by using a target, etc., and a surveying instrument (total station) surveys three-dimensional coordinates of the measurement point by distance and angle measuring. As for recent surveying instruments, the surveying instrument automatically tracks a target, so that a worker can perform a survey individually while moving among measurement points (for example, Patent Literature 1).

CITATION LIST

Patent Literature

Patent Literature 1: Japanese Published Unexamined Patent Application No. 2009-229192

SUMMARY OF INVENTION

Technical Problem

By using the art disclosed in Patent Literature 1, a worker can perform a survey individually, however, in a survey using a surveying instrument (total station), a worker needs to stabilize the surveying instrument on a ground surface while adjusting the height by using a tripod, and level the surveying instrument and adjust the center. In these works necessary for the surveying instrument, it is difficult to handle the instrument due to its size and weight, and it is considered that handling of the instrument requires experience and know-how.

The present invention has been made in order to solve the problem described above, and an object thereof is to provide a novel wearable-type surveying device and a surveying method using the same which makes handling of the device by the worker easy.

Solution to Problem

In order to solve the problem described above, a surveying device according to an aspect of the present invention includes a wearable device to be worn on the head of a worker, including a posture sensor configured to detect a posture of the device in three-axis directions of an x-axis set in a line-of-sight direction of the worker, a y-axis set in a left-right direction of the worker, and a z-axis set in an up-down direction of the worker, a distance-measuring unit configured to measure a linear distance from a distance measuring start point to a measurement point by emitting distance-measuring light in the x-axis direction or imaging in the x-axis direction from two different points, and a position sensor having a fixed disposition relationship with the distance-measuring unit based on the three-axis directions and configured to detect a position of the device, an operation unit configured to issue a measurement command to the wearable device, a disposition storage unit configured to store the disposition relationship, and an arithmetic unit configured to, upon receiving the measurement command, measure the linear distance by the distance-measuring unit, acquire position information of the position sensor, posture information of the posture sensor, and the disposition relationship, calculate coordinates of the distance measuring start point of the distance-measuring unit by moving coordinates acquired by the position sensor in the three-axis directions based on the disposition relationship, and recognize and perform a survey of coordinates moved by the linear distance in the x-axis direction from the coordinates of the distance measuring start point as coordinates of the measurement point.

In the aspect described above, it is also preferable that the surveying device further includes a display capable of being viewed by the worker, and a design data storage unit configured to store CAD design data including a wire frame of an object to be constructed at a survey site of the worker, wherein the arithmetic unit synchronizes a space of the CAD design data and a space of the wearable device, displays the wire frame viewed from a position and a posture of the wearable device on the display so that the wire frame is superimposed on an actual landscape of the survey site, surveys an actual point at the survey site corresponding to a survey point designated on the wire frame as the measurement point, and calculates coordinate differences between the survey point and the measurement point.

In order to solve the problem described above, a surveying method according to an aspect of the present invention using a wearable device to be worn on the head of a worker, including a posture sensor configured to detect a posture of the device in three-axis directions of an x-axis set in a line-of-sight direction of the worker, a y-axis set in a left-right direction of the worker, and a z-axis set in an up-down direction of the worker, a distance-measuring unit configured to measure a linear distance from a distance measuring start point to a measurement point by emitting distance-measuring light in the x-axis direction or imaging in the x-axis direction from two different points, and a position sensor having a fixed disposition relationship with the distance-measuring unit based on the three-axis directions and configured to detect a position of the device, includes (a) a step of measuring the linear distance by the distance-measuring unit, (b) a step of acquiring position information of the wearable device from the position sensor, (c) a step of acquiring posture information in the three-axis directions of the wearable device from the posture sensor, (d) a step of acquiring the disposition relationship between the distance-measuring unit and the position sensor, and (e) a step of calculating coordinates of the distance measuring start point of the distance-measuring unit by moving coordinates acquired by the position sensor in the three-axis directions based on the disposition relationship, and recognizing and performing a survey of coordinates moved by the linear distance in the x-axis direction from the coordinates of the distance measuring start point as coordinates of the measurement point.

In the aspect described above, it is also preferable that the wearable device includes a display capable of being viewed by the worker, and the surveying method further includes, before the step (a), a step of acquiring CAD design data including a wire frame of an object to be constructed at a survey site of the worker, and displaying the wire frame viewed from a position and a posture of the wearable device on the display so that the wire frame is superimposed on an actual landscape of the survey site, and in the step (e), a step of surveying an actual point at the survey site corresponding to a survey point designated on the wire frame as the measurement point, and calculating coordinate differences between the survey point and the measurement point.

It is also preferable that a storage medium storing the surveying method according to the aspect described above.

Advantageous Effects of Invention

According to the present invention, a novel wearable-type surveying device and a surveying method using the same, which makes handling of the device by the worker easy, can be provided.

DESCRIPTION OF EMBODIMENTS

Next, preferred embodiments of the present invention will be described with reference to the drawings. In the following description of embodiments, the same components are provided with the same reference signs, and overlapping description is omitted.

1. First Embodiment 1-1. Configuration of Surveying Device

Figure 1:
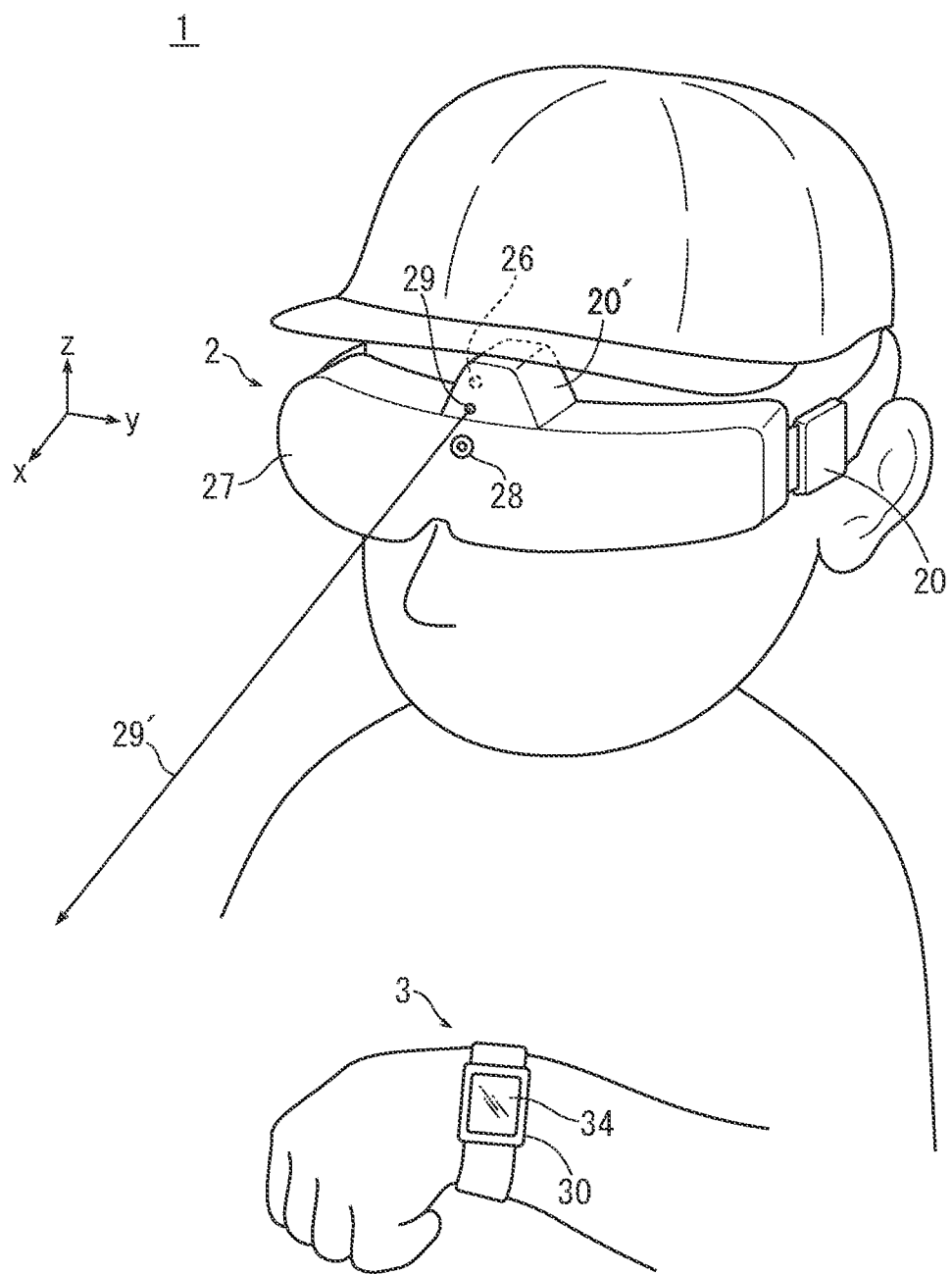
FIG. 1 is a view schematically illustrating a configuration of a surveying device according to a first embodiment of the present invention.
Figure 2:
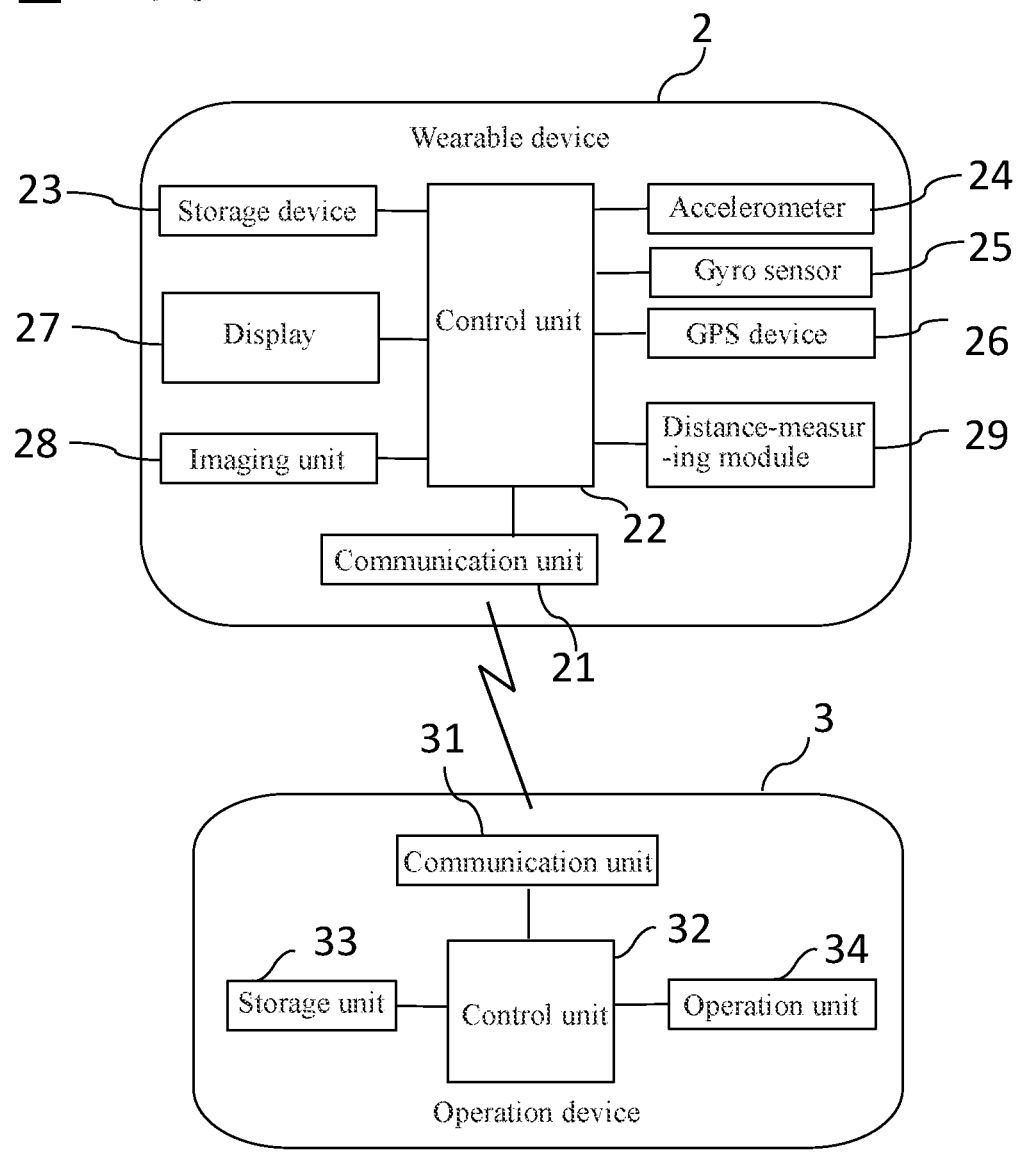
FIG. 2 is a configuration block diagram of the surveying device according to the first embodiment.

FIG. 1 is a view schematically illustrating a configuration of a surveying device 1 according to a first embodiment, and FIG. 2 is a configuration block diagram of the same surveying device 1. The surveying device 1 of this embodiment mainly includes a wearable device 2 and an operation device 3.

1-2. Configuration of Wearable Device

The wearable device 2 is an eyeglasses-type wearable display to be worn on the head of a worker. The wearable device 2 includes, as illustrated in FIG. 2, a communication unit 21, a control unit 22, a storage unit 23, an accelerometer 24, a gyro sensor 25, a GPS device 26, a display 27, an imaging unit 28, and a distance-measuring module 29. Here, the elements 21, 22, 23, 24, and 25 are configured by using a dedicated module and IC configured by using integrated-circuit technology, and are housed in a processing BOX 20 provided at a temple portion of the eyeglasses (FIG. 1). The position of the processing BOX 20 is not limited to the example illustrated in FIG. 1.

The communication unit 21 can communicate wirelessly with a communication unit 31 (described later) of the operation device 3. For communication, any one of or a combination of wide-area communication such as 5G (5th generation mobile communication system) and LTE (Long-Term Evolution), short-range communication such as Bluetooth (registered trademark) and infrared communication, and other wireless lines can be used.

The display 27 is a liquid crystal or organic EL screen, and is disposed so as to cover the eyes of the worker. The imaging unit 28 is an image sensor (for example, a CCD sensor or CMOS sensor), and positions of the respective pixels can be identified on an imaging device. The imaging unit 28 is provided at, for example, an upper portion central position of the display 27 so that its field of view substantially matches a field of view of the worker (FIG. 1). By setting this position as an origin, the imaging unit 28 performs imaging in a worker's line-of-sight direction (x-axis direction described later) at a wide angle in up-down and left-right directions of the origin. An image imaged by the imaging unit 28 is displayed on the display 27.

The accelerometer 24 detects accelerations in local three-axis directions of the wearable device 2. The gyro sensor 25 detects rotations around the local three axes of the wearable device 2. An x-axis direction of the wearable device 2 corresponds to the worker's line-of-sight direction (front-rear direction), a y-axis direction corresponds to the left-right direction of the worker, and a z-axis direction corresponds to the up-down direction of the worker, respectively (hereinafter, the local three axes of the wearable device 2 are represented by lowercase letters of x, y, and z. These local three axes are the "three-axis directions" in the claims). The accelerometer 24 and the gyro sensor 25 are the "posture sensors" of the wearable device 2 in the claims.

The distance-measuring module 29 is configured by using integrated-circuit technology, and includes a light transmitting unit and a light receiving unit. The distance-measuring module 29 emits distance-measuring light 29' (FIG. 1), for example, infrared pulsed laser, etc., and by using reflected light of the distance-measuring light 29' from a measurement point, measures a distance from a distance measuring start point to the measurement point from a phase difference of the reflected light from internal reference light or based on a time to light reception and light speed. The distance-measuring module 29 can perform both of a reflection prism distance measuring in which a distance to a prism is measured by reflecting the distance-measuring light 29' on the prism, and a non-prism distance measuring in which a distance to an object (target, etc.) other than a prism is measured by irradiating the object with the distance-measuring light 29'. The distance-measuring module 29 is preferably provided at a position near a line-of-sight center of the worker, for example, in a housing portion 20' formed at a center of a frame rim of the eyeglasses (FIG. 1). The distance-measuring module 29 is housed so that an optical axis of the distance-measuring light 29' matches the x-axis (worker's line-of-sight direction) of the posture sensor 24, 25 described above. The distance-measuring module 29 is the "distance-measuring unit" of the wearable device 2 in the claims.

Figure 5:
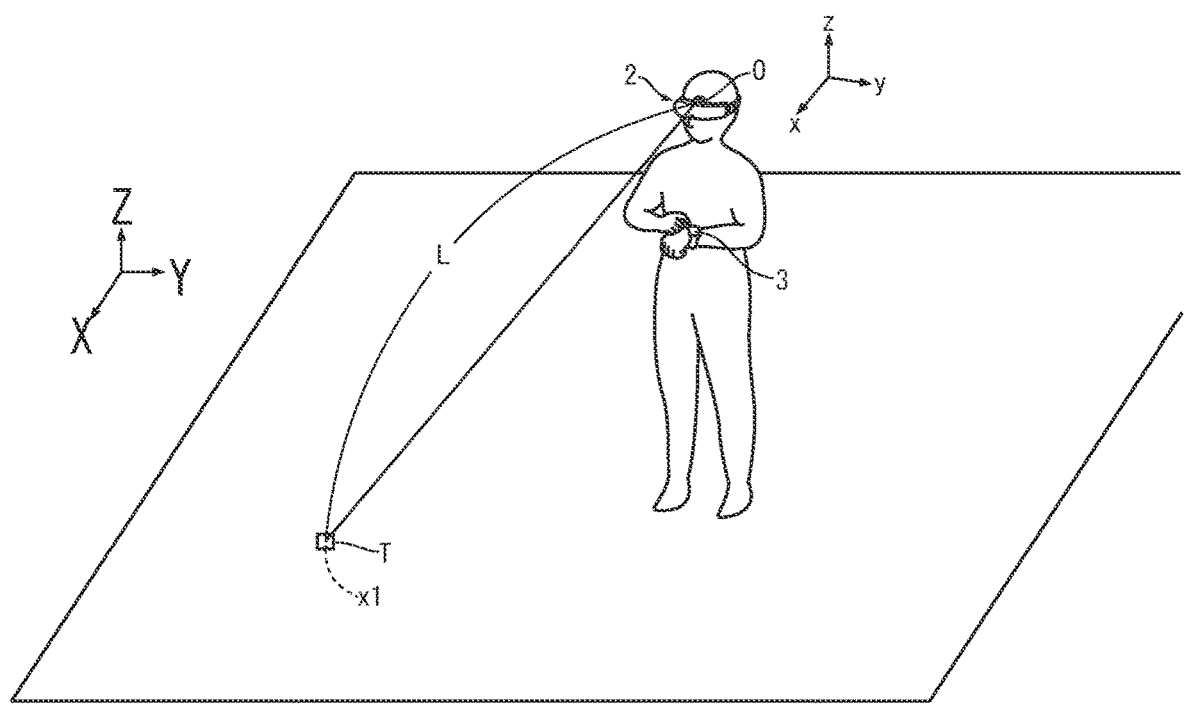
FIG. 5 is a work image view of the survey according to the first embodiment.

The GPS device 26 detects absolute coordinates (hereinafter, three axes of an absolute coordinate system are represented by uppercase letters of X, Y, and Z. Refer to FIG. 5 described later) of the wearable device 2 based on a GPS signal from a GPS (Global Positioning System). The GPS device 26 is the "position sensor" of the wearable device 2 in the claims. The GPS device 26 may use positioning information obtained by a GNSS, a quasi-zenith satellite system, GALILEO, or GLONAS. The GPS device 26 is configured by using a dedicated module and IC configured by using integrated-circuit technology, and is disposed so as to have a fixed disposition relationship with the distance-measuring module 29.

Specifically, based on local three-axis directions (x, y, and z) of the wearable device 2 detected by the posture sensors 24 and 25, separating distances between the distance-measuring module 29 (distance-measuring unit) and the GPS device 26 (position sensor) in the respective directions are measured in advance, and respective fixed separating distances (dx, dy, and dz) are stored in the storage unit 23. This will be described with reference to FIGS. 3A and 3B as examples.

Figure 3A:
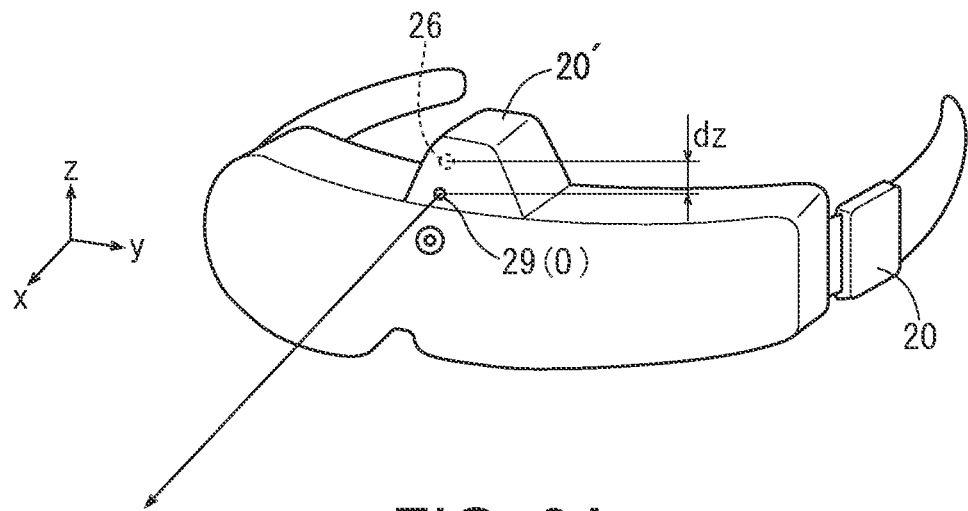
FIG. 3A illustrates a disposition example of a distance-measuring unit and a position sensor.

(i) In FIG. 3A, the GPS device 26 is housed in the housing portion 20', and the GPS device 26 is offset by the distance dz in a +z direction from the distance-measuring module 29.

Figure 3B:
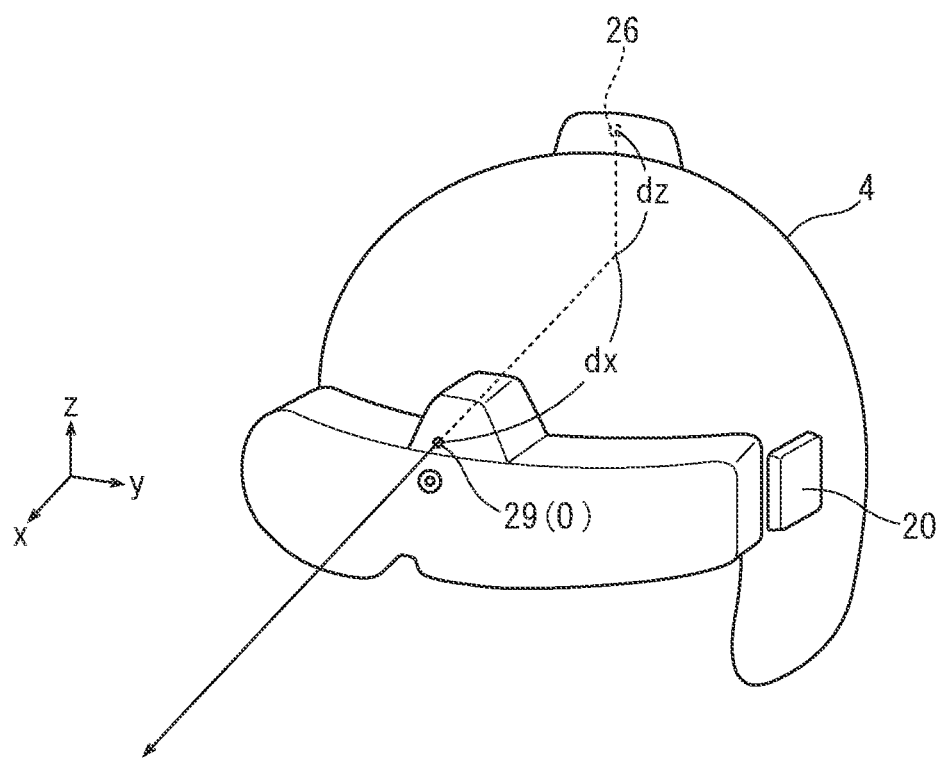
FIG. 3B illustrates another disposition example of a distance-measuring unit and a position sensor.

(ii) In FIG. 3B, the GPS device 26 is disposed on the top of a helmet 4 to which the wearable device 2 is fixed, and the GPS device 26 is offset by the distance dx in a −x direction and the distance dz in the +z direction from the distance-measuring module 29.

In this way, as long as the separating distances between the distance-measuring module 29 and the GPS device 26 are fixed based on the local three-axis directions detected by the posture sensors 24 and 25, the disposition relationship between these is free.

The control unit 22 includes a CPU (Central Processing Unit), and performs, as arithmetic controls, detection of posture information from the posture sensors 24 and 25, detection of position information from the position sensor 26, information transmission and reception through the communication unit 21, imaging by the imaging unit 28, display on the display 27, a distance measuring by the distance-measuring module 29, and calculation of three-dimensional coordinates of a measurement point (described later). The control unit 22 may include a PLD (Programmable Logic Device) such as an FPGA (Field Programmable Gate Array) instead of the CPU. The control unit 22 is the "arithmetic unit" in the claims. The storage unit 23 includes a ROM and a RAM, enables the respective arithmetic controls of the control unit 22, and stores the disposition relationship between the distance-measuring module 29 and the GPS device 26. The storage unit 23 is the "disposition storage unit" in the claims.

1-3. Configuration of Operation Device

The operation device 3 is a controller of the wearable device 2. The operation device 3 is the "operation unit" in the claims. A worker wears the wearable device 2 on his/her head, and can operate the wearable device 2 by operating the operation device 3 with his/her fingers. In FIG. 1, the operation device 3 is configured as a watch-type wearable device, however, it may be a mobile terminal (smartphone), a tablet terminal, or a small-sized terminal configured specially.

The operation device 3 includes, as illustrated in FIG. 2, the communication unit 31, a control unit 32, a storage unit 33, and an operation unit 34. The communication unit 31 has the same standards as those of the communication unit 21 of the wearable device 2, and can communicate wirelessly with the communication unit 21. The control unit 32 includes a CPU and executes an installed operation application. The storage unit 33 includes a ROM and a RAM, and enables the control unit 32 to execute the operation application. The operation unit 34 is a touch panel display unit that displays a screen of the operation application. The screen of the operation unit 34 contains at least an operation key for issuing a measurement instruction to the wearable device 2. The elements 31, 32, and 33 are configured by using a dedicated module and IC configured by using integrated-circuit technology, and are housed in a processing BOX 30 provided at a band portion of the watch (FIG. 1) together with the operation unit 34. The position of the processing BOX 30 is not limited to the example illustrated in FIG. 1.

1-4. Surveying Method

Figure 4:
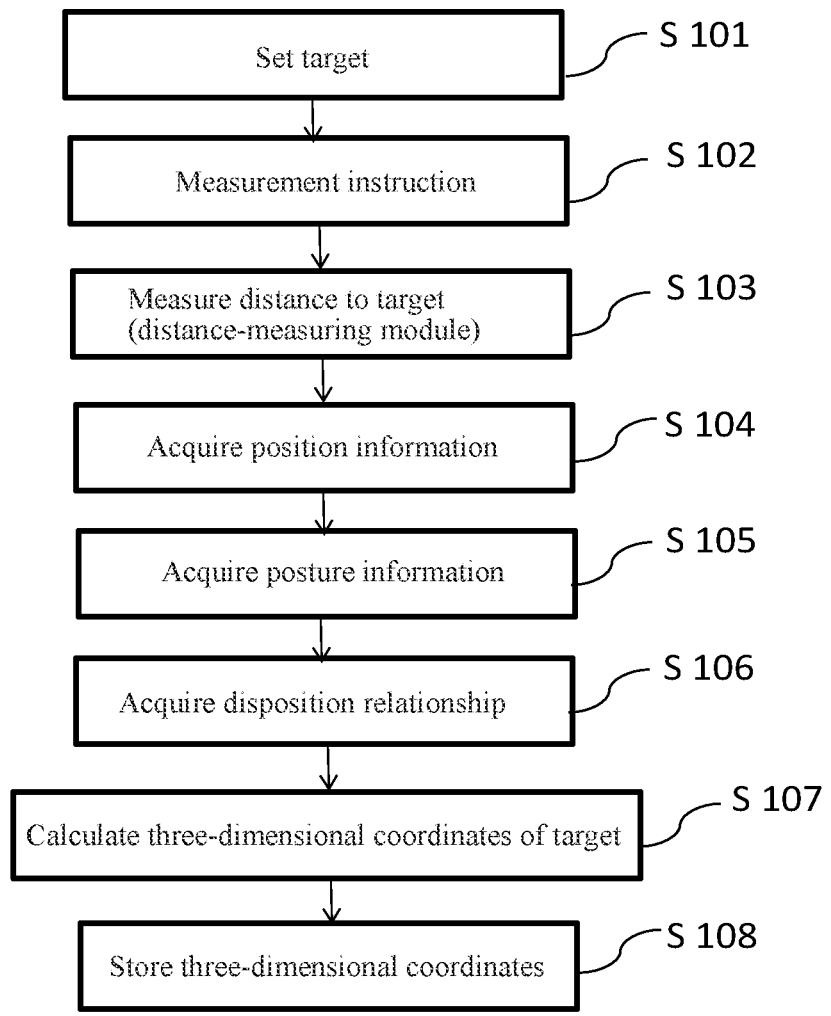
FIG. 4 is a flowchart of a survey according to the first embodiment.

Next, a surveying method using the surveying device 1 will be described. FIG. 4 is a flowchart of a survey according to the first embodiment, and FIG. 5 is a work image of the same survey.

First, in Step S101, a worker sets a target T (FIG. 5) at a measurement point x1 that the worker wants to measure.

Next, in Step S102, the worker wears the wearable device 2 on his/her head and carries the operation device 3, and issues a measurement instruction to the wearable device 2 by using the operation device 3 while setting his/her viewpoint on the measurement point x1 (while looking straight ahead in order to set the x-axis direction of the wearable device 2 toward the measurement point x1).

Upon receiving the measurement instruction, the processing shifts to Step S103, and the control unit 22 of the wearable device 2 emits distance-measuring light 29' and measures a linear distance L to the target T (FIG. 5).

At the same time as Step S103, in Step S104, the control unit 22 acquires position information (GPS signal) from the position sensor (GPS device 26).

At the same time as Steps S103 and S104, in Step S105, the control unit 22 acquires posture information (local three-axis directions) of the wearable device 2 from the posture sensor (accelerometer 24 and gyro sensor 25).

At the same time as Steps S103 to S105, in Step S106, the control unit 22 reads out the disposition relationship between the distance-measuring module 29 and the GPS device 26 from the storage unit 23.

Next, the processing shifts to Step S107, and the control unit 22 calculates three-dimensional coordinates of the measurement point x1 based on the information acquired in Steps S103 to S106. This will be described with reference to FIGS. 3A and 3B as examples.

(i) When the disposition relationship between the distance-measuring module 29 and the GPS device 26 is as illustrated in FIG. 3A, coordinates obtained by moving coordinates (absolute coordinates) acquired by the GPS device 26 downward by the fixed separating distance dz in the local z-axis direction of the wearable device 2 are coordinates (absolute coordinates) of a distance measuring start point O of the distance-measuring module 29. Then, coordinates moved by the linear distance L from the coordinates of the distance measuring start point O in the local x-axis direction of the wearable device 2, are three-dimensional coordinates (absolute coordinates) of the measurement point x1.

(ii) When the disposition relationship between the distance-measuring module 29 and the GPS device 26 is as illustrated in FIG. 3B, coordinates obtained by moving coordinates (absolute coordinates) acquired by the GPS device 26 downward by the fixed separating distance dz in the local z-axis direction of the wearable device 2 and forward by the fixed separating distance dx in the local x-axis direction of the wearable device 2 are coordinates (absolute coordinates) of the distance measuring start point O of the distance-measuring module 29. Then, coordinates moved by the linear distance L in the local x-axis direction from the coordinates of the distance measuring start point O of the wearable device 2, are three-dimensional coordinates (absolute coordinates) of the measurement point x1.

That is, coordinates obtained by moving coordinates (absolute coordinates) acquired by the GPS device 26 by the respective fixed separating distances based on local three-axis directions of the wearable device 2 detected by the posture sensors 24 and 25, can be calculated as a distance measuring start point O (absolute coordinates) of the distance-measuring module 29. Then, coordinates moved by the linear distance L measured by the distance-measuring module 29 in the local x-axis direction of the wearable device 2 from the coordinates of the distance measuring start point O, can be calculated as three-dimensional coordinates (absolute coordinates) of the measurement point x1. The expression "move" herein is used to mean arithmetical movement in a space.

Next, the processing shifts to Step S108, and the control unit 22 stores the three-dimensional coordinates of the measurement point x1 in the storage unit 23. The storage site is not limited to the storage unit 23. The three-dimensional coordinates may be stored in the storage unit 33 of the operation device 3, or in a management device or management server with which communication can be made through the communication unit 21.

Effect

As described above, according to the present embodiment, the surveying device 1 can calculate three-dimensional coordinates of a measurement point by space vector movement in a case where a disposition relationship between the distance-measuring unit (distance-measuring module 29) and the position sensor (GPS device 26) and an optical axis direction of the distance-measuring module 29 at the time of a measurement can be grasped by the posture sensors (accelerometer 24 and gyro sensor 25). Therefore, by a method different from that of the surveying instrument (total station), three-dimensional coordinates of the measurement point can be surveyed. In addition, the surveying device 1 is a wearable-type device that only needs to be worn on the head, so that difficult work required by the surveying instrument (total station) is not necessary, and a worker can very easily handle the surveying device.

2. Second Embodiment 2-1. Configuration of Surveying Device

Figure 6:
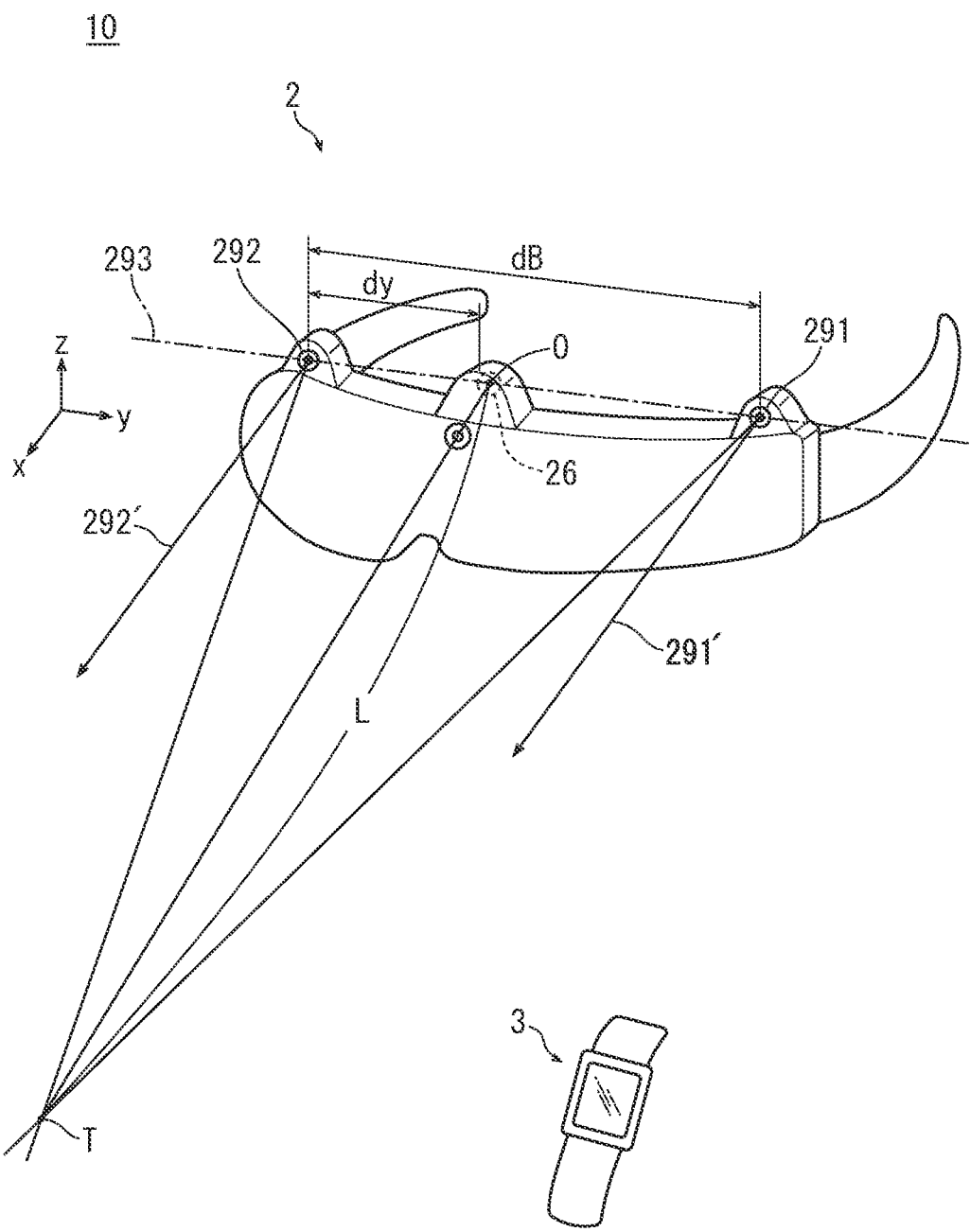
FIG. 6 is a view schematically illustrating a configuration of a surveying device according to a second embodiment of the present invention.
Figure 7:
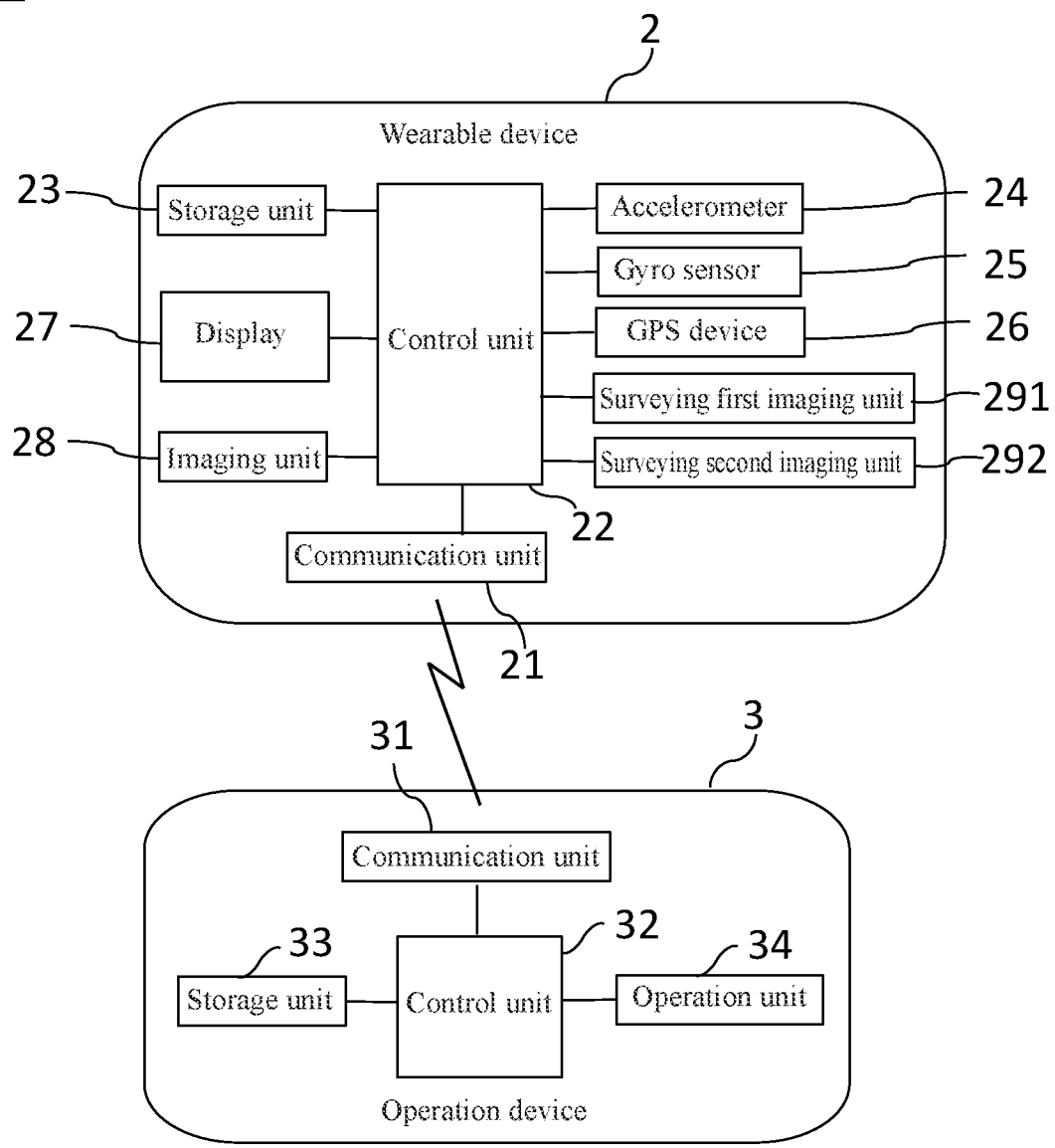
FIG. 7 is a configuration block diagram of the surveying device according to the second embodiment.

FIG. 6 is a view schematically illustrating a configuration of a surveying device 10 according to a second embodiment, and FIG. 7 is a configuration block diagram of the same surveying device 10. The surveying device 10 of the present embodiment also mainly includes the wearable device 2 and the operation device 3. The operation device 3 is the same as in the first embodiment. The wearable device 2 includes, instead of the distance-measuring module 29, a surveying first imaging unit 291 and a surveying second imaging unit 292 (hereinafter, respectively abbreviated as a first imaging unit 291 and a second imaging unit 292) as the distance-measuring unit.

The first imaging unit 291 and the second imaging unit 292 are image sensors (for example, CCD sensors or CMOS sensors) to be used for photogrammetry, and positions of the respective pixels can be identified on an imaging device. For photogrammetry, the first imaging unit 291 and the second imaging unit 292 are disposed on the same imaging baseline 293 (FIG. 6), and their imaging optical axes 291' and 292' (FIG. 6) are respectively parallel to the local x-axis of the wearable device 2. The first imaging unit 291 and the second imaging unit 292 are disposed so that their imaging ranges overlap each other to include a common measurement point (target) and characteristic object. The first imaging unit 291 is provided at an upper left end portion of the display 27, the second imaging unit 292 is provided at an upper right end portion of the display 27, and imaging is performed in the local x-axis direction of the wearable device 2 from two different points (FIG. 6). A center of a baseline length dB of the imaging baseline 293 of the first imaging unit 291 and the second imaging unit 292 is a distance measuring start point O of the distance-measuring unit of the present embodiment (FIG. 6).

Respective separating distances between the first imaging unit 291, the second imaging unit 292 (distance-measuring unit) and the GPS device 26 (position sensor) are fixed based on the local three-axis directions of the wearable device 2 detected by the posture sensors 24 and 25. For example, in FIG. 6, the first imaging unit 291 and the second imaging unit 292 are disposed so that their imaging baseline 293 becomes parallel to the local y axis of the wearable device 2. The GPS device 26 is disposed at the center of the baseline length dB of the imaging baseline 293, that is, at the distance measuring start point O. Further, the GPS device 26 is disposed at the same height (same height in the local z direction) as an imaging center of the first imaging unit 291 and the second imaging unit 292. Based on the baseline length dB of the imaging baseline 293, the fixed separating distance dy between the first imaging unit 291 and the GPS device 26 is measured and stored in advance in the storage unit 23 (the same applies to the second imaging unit 292 and the GPS device 26).

In this way, when dispositions of the first imaging unit 291, the second imaging unit 292, and the GPS device 26 are fixed and disposed based on local three-axis directions (x, y, z) detected by the posture sensors 24 and 25, their disposition relationships are arbitrary.

2-2. Surveying Method

Figure 8:
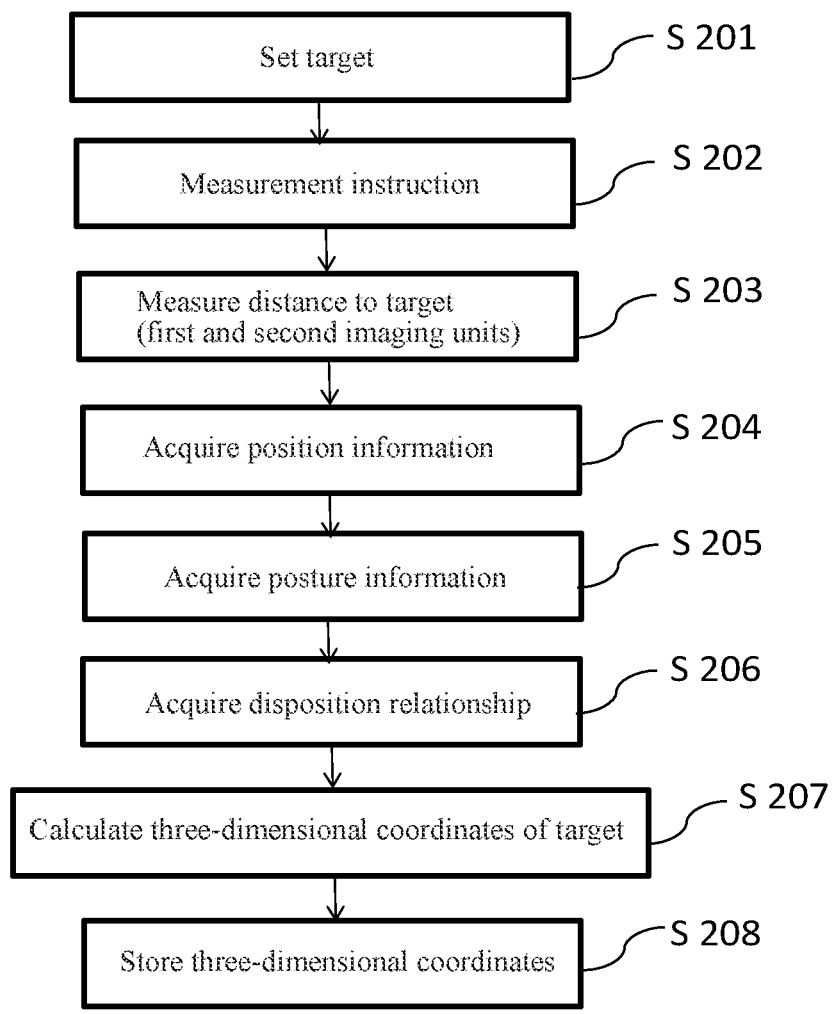
FIG. 8 is a flowchart of a survey according to the second embodiment.

FIG. 8 is a flowchart of a survey according to the second embodiment. In Step S201, a worker sets a target T at a measurement point x1 that the worker wants to measure. Next, in Step S202, the worker wears the wearable device 2 on his/her head and carries the operation device 3, and issues a measurement instruction to the wearable device 2 while setting his/her viewpoint on the measurement point x1.

Upon receiving the measurement instruction, the processing shifts to Step S203, and the control unit 22 of the wearable device 2 acquires images including the target T by the first imaging unit 291 and the second imaging unit 292.

At the same time, the control unit 22 acquires position information (GPS signal) from the position sensor (GPS device 26) in Step S204, acquires posture information (local three-axis directions) of the wearable device 2 from the posture sensors (accelerometer 24 and gyro sensor 25) in Step S205, and reads the disposition relationships between the first imaging unit 291, the second imaging unit 292, and the GPS device 26 from the storage unit 23 in Step S206.

Next, the processing shifts to Step S207, and the control unit 22 calculates three-dimensional coordinates of the measurement point xl based on the information acquired in Steps S203 to S206. This will be described with reference to FIG. 6 as an example. By a known photogrammetry technique, the control unit 22 measures a linear distance L from the distance measuring start point O to the target T in a depth direction (local x-axis direction) from the baseline length dB of the first imaging unit 291 and the second imaging unit 292 and a parallax difference between the images acquired by the first and second imaging units 291 and 292. In the case of FIG. 6, since the GPS device 26 is disposed at the distance measuring start point O, coordinates obtained by moving coordinates (absolute coordinates) acquired by the GPS device 26 by the linear distance L in the local x-axis direction of the wearable device 2 are the three-dimensional coordinates (absolute coordinates) of the measurement point xl.

In this way, coordinates obtained by moving coordinates (absolute coordinates) acquired by the GPS device 26 by the respective fixed separating distances based on local three-axis directions of the wearable device 2 detected by the posture sensors 24 and 25 can be calculated as the distance measuring start point O (absolute coordinates) of the first imaging unit 291 and the second imaging unit 292. Then, coordinates moved by the linear distance L measured by photogrammetry in the local x-axis direction of the wearable device 2 from the coordinates of the distance measuring start point O can be calculated as three-dimensional coordinates (absolute coordinates) of the measurement point xl. "Move" used herein also means an arithmetical movement in a space.

Next, the processing shifts to Step S208, and the control unit 22 stores the three-dimensional coordinates of the measurement point xl in the storage unit 23. As in the first embodiment, the storage site is not limited to the storage unit 23.

Effect

As described above, even with a distance-measuring unit using a photogrammetry technique as in the present embodiment, a survey similar to that in the first embodiment can be performed, and an effect equivalent to the effect of the first embodiment is obtained.

3. Third Embodiment 3-1. Configuration of Surveying Device

Figure 9:
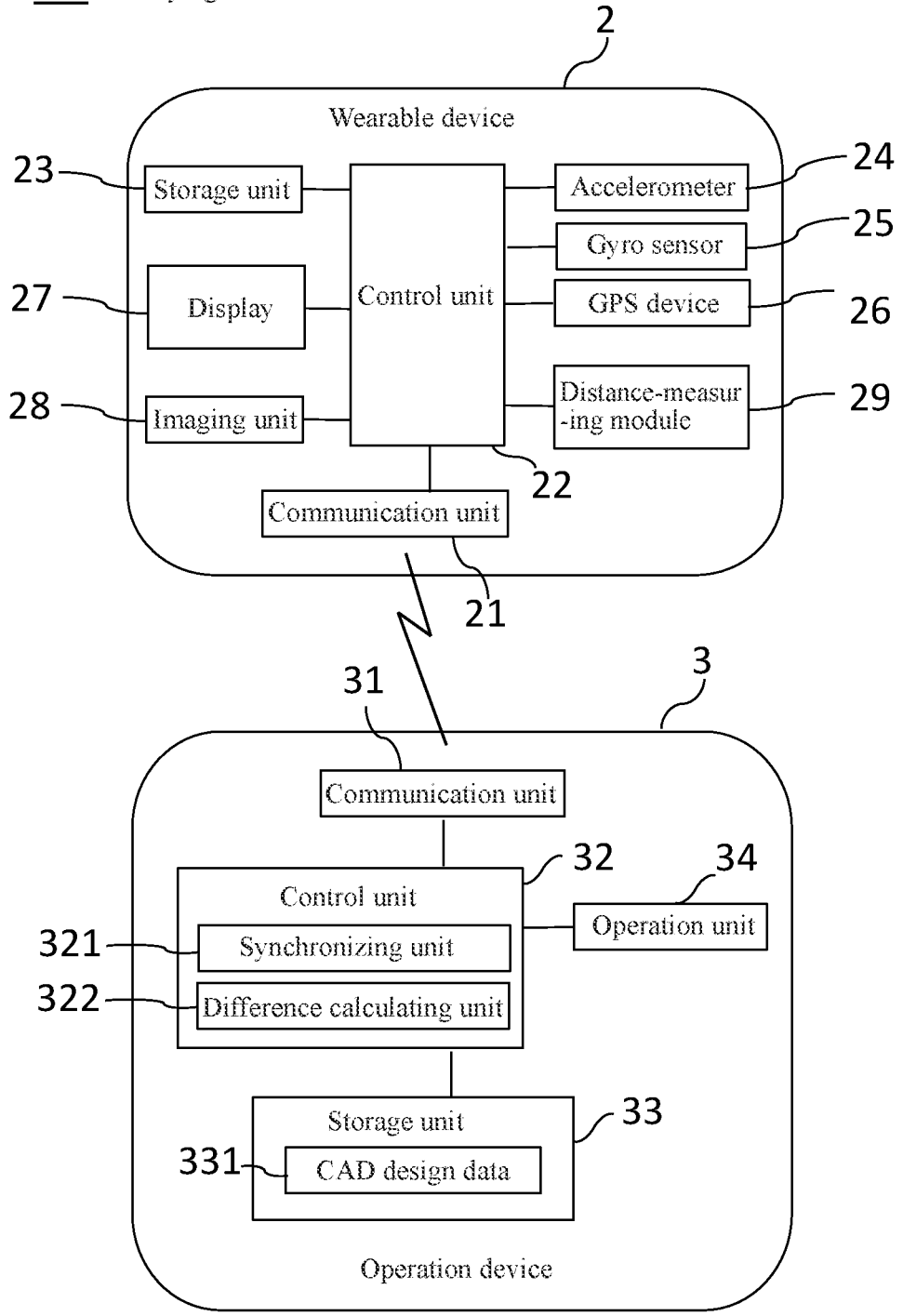
FIG. 9 is a configuration block diagram of a surveying device according to a third embodiment of the present invention.

FIG. 9 is a configuration block diagram of a surveying device 100 according to a third embodiment. The surveying device 100 of this embodiment also mainly includes the wearable device 2 and the operation device 3. The wearable device 2 is the same as in the first embodiment. The operation device 3 includes a synchronizing unit 321 and a difference calculating unit 322 in the control unit 32. Each of the synchronizing unit 321 and the difference calculating unit 322 is configured by software as one of the functional units of the control unit 32. The operation device 3 stores CAD design data 331 in the storage unit 33. The CAD design data 331 includes information on a three-dimensional wire frame of an object (architectural structure, road, bridge, tunnel, etc.) to be constructed at the survey site of the worker. The storage unit 33 is the "design data storage unit" in the claims. When the storage unit 33 stores the CAD design data 331, it may include a high-capacity storage medium such as an HDD.

The synchronizing unit 321 synchronizes a space of the CAD design data 331 and a space of the wearable device 2 (imaging unit 28).

As a synchronizing method, for example, there is a method in which, for the surveying device 100, a reference point and a reference direction are set at a survey site. As the reference point, a known coordinate point (point at known coordinates) is selected. As the reference direction, a characteristic point different from the reference point is arbitrarily selected, and a direction from the reference point to the characteristic point is set. Then, in a state where the wearable device 2 is disposed at the reference point, zero coordinates of the GPS device 26 are set to the reference point, and the wearable device 2 is leveled, the x-axis direction of the wearable device 2 is set in the reference direction, and a reference posture of the wearable device 2 is aligned with the reference direction. Thereafter, the synchronizing unit 321 synchronizes the space of the CAD design data 331 and the space of the wearable device 2 (space of the imaging unit 28) based on the reference point and the reference direction. When the synchronization is completed, on the display 27 of the wearable device 2, a wire frame of the CAD design data 331 viewed from a position and a posture of the wearable device 2 is displayed so as to be superimposed on an actual landscape of the survey site imaged by the imaging unit 28. The worker performs this synchronization once before the start of the survey or for each measurement of each measurement point. When the synchronization is performed for each measurement of each measurement point, measurement accuracy is correspondingly improved.

As another synchronizing method, there is a method in which a disposition relationship between the imaging unit 28 and the GPS device 26 of the wearable device 2 is stored in advance in the disposition storage unit. By storing the disposition relationship between the GPS device 26 and the imaging unit 28 in advance, coordinates obtained by moving coordinates (absolute coordinates) acquired by the GPS device 26 by respective fixed separating distances based on local three-axis directions of the wearable device 2 detected by the posture sensors 24 and 25 can be calculated as an imaging center (absolute coordinates) of the imaging unit 28, so that the imaging center of the imaging unit 28 can be synchronized with the absolute coordinate system of the CAD. A posture of the imaging unit 28 can be grasped by the posture sensors 24 and 25, so that when the synchronization is completed, on the display 27 of the wearable device 2, a wire frame of the CAD design data 331 viewed from the position and posture of the wearable device 2 is displayed so as to be superimposed on an actual landscape of the survey site imaged by the imaging unit 28. The synchronizing unit 321 performs this synchronization each time a measurement instruction for each measurement point is issued.

For a survey point designated on the wire frame, the difference calculating unit 322 calculates differences between design coordinates and actual coordinates in the space of the CAD design data 331 (described later).

3-2. Surveying Method

Figure 10:
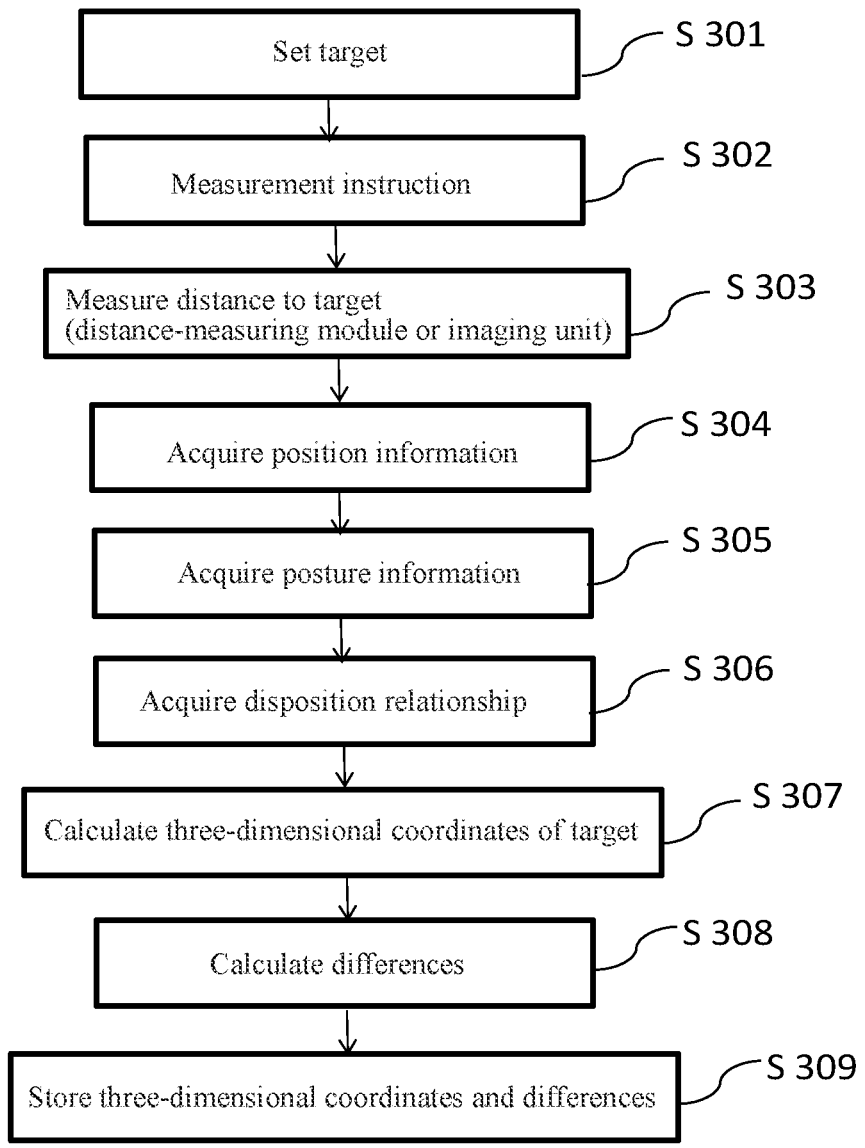
FIG. 10 is a flowchart of a survey according to the third embodiment.

FIG. 10 is a flowchart of a survey according to the third embodiment, and FIGS. 11 and 12 are work images of the same survey.

Figure 11A:
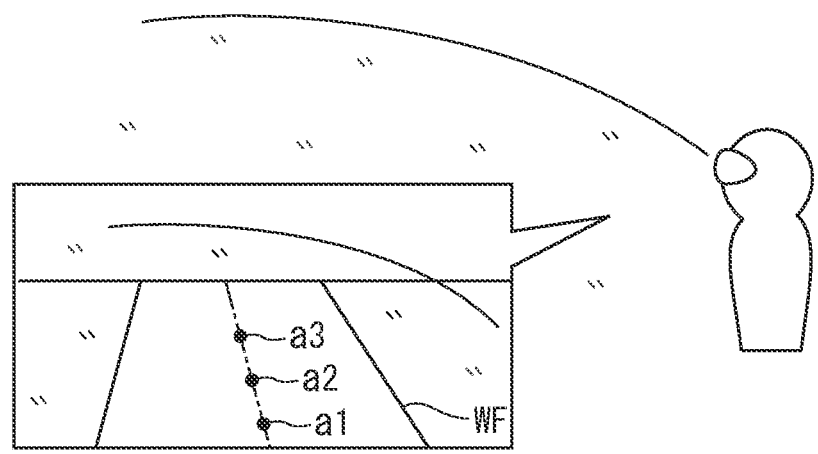
FIG. 11A is a work image of a survey according to the third embodiment.
Figure 11B:
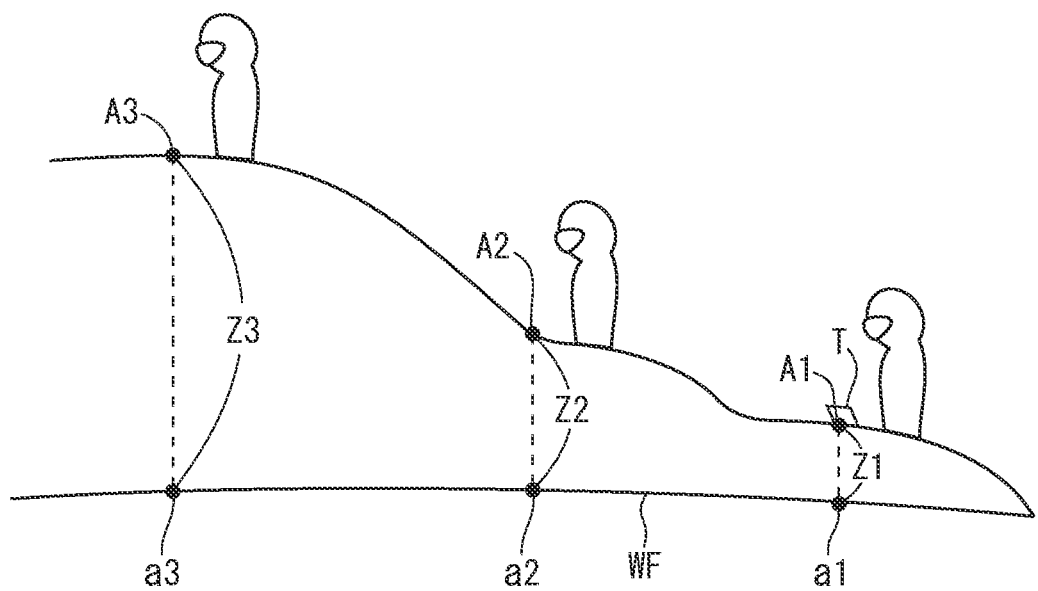
FIG. 11B is a work image of a survey according to the third embodiment.

FIGS. 11A and 11B illustrate an example of a survey using the surveying device 100 according to the third embodiment, and are work image views in an actual situation investigation (route survey) for road construction. By using this as an example, the flow in FIG. 10 will be described.

It is assumed that a new road will be constructed at the survey site. A worker wears the wearable device 2 on his/her head and carries the operation device 3, and views display on the display 27. On the display 27, a wire frame WF of the CAD design data 331 viewed from a position and a posture of the wearable device 2 is displayed to be superimposed on an actual landscape of the survey site imaged by the imaging unit 28 (FIG. 11A).

With respect to survey points designated on the wire frame WF, for example, survey points a1, a2, a3, . . . (FIG. 11A) designated on a centerline of the road width, the worker performs a survey of actual points at the survey site corresponding to the respective survey points by using the wire frame WF displayed on the display 27 as a guide.

Specifically, a survey of the survey point a1 will be described. First, in Step S301, the worker searches for an actual landform point corresponding to the survey point a1 on the wire frame WF in the vertical direction on the display 27 of the wearable device 2, and recognizes this point as a measurement point A1 and sets the target T (FIG. 11B). When the worker issues a measurement instruction (S302), as in the first embodiment, the distance-measuring module 29 acquires a linear distance L, the position sensor 26 acquires position information, the posture sensors 24 and 25 acquire posture information, and the disposition relationship is acquired from the storage unit 23 (S303 to S307), and three-dimensional coordinates (absolute coordinates) of the measurement point A1 are calculated (S306).

Next, the processing shifts to Step S308, and the difference calculating unit 322 grasps coordinates of the measurement point A1 in the space of the CAD, and calculates a difference between the survey point a1 and the actual point (measurement point A1) in the Z direction in the space of the CAD. In the example in FIGS. 11A and 11B, the difference calculating unit 322 calculates the difference Z1 (FIG. 11B).

Figure 12A:
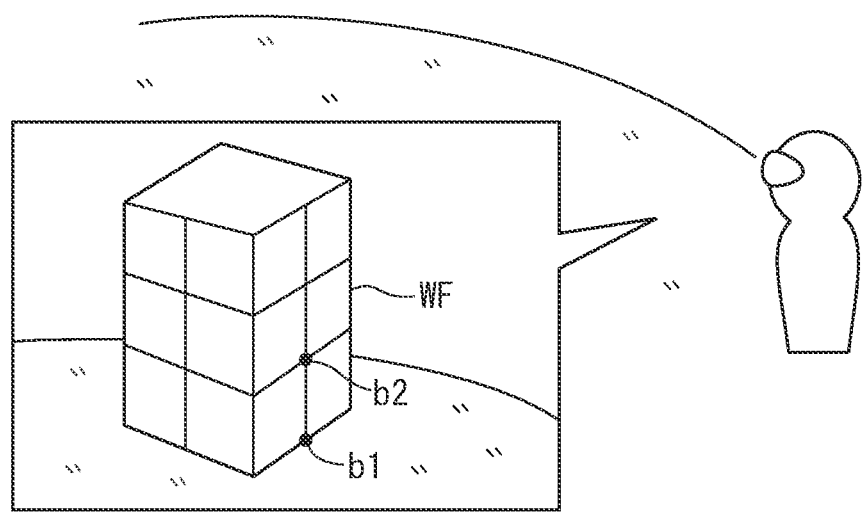
FIG. 12A is a work image of a survey according to the third embodiment.
Figure 12B:
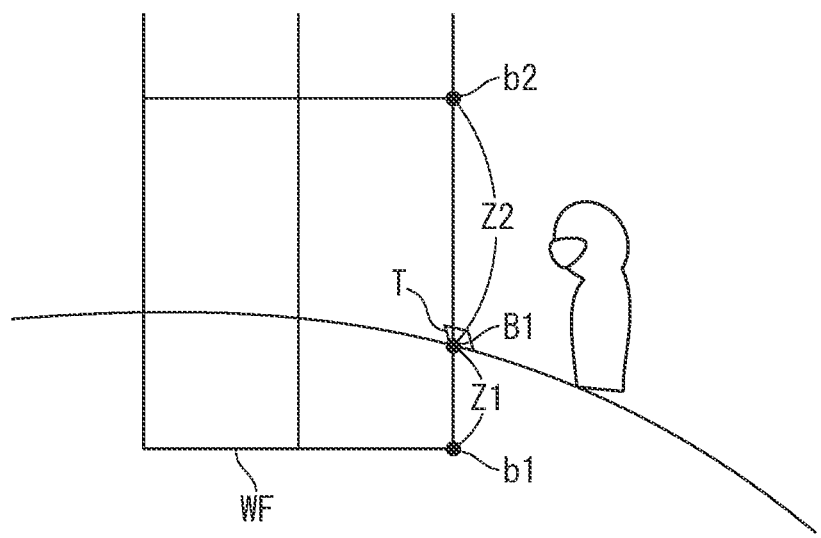
FIG. 12B is a work image of a survey according to the third embodiment.

FIGS. 12A and 12B illustrate an example of a survey using the surveying device 100 according to the third embodiment, and is a work image view in an actual situation investigation before construction of a building. By using this as an example, the flow in FIG. 10 will be described.

It is assumed that a new building will be constructed at the survey site. The worker wears the wearable device 2 on his/her head and carries the operation device 3, and views display on the display 27. On the display 27, a wire frame WF of the CAD design data 331 viewed from a position and a posture of the wearable device 2 is displayed so as to be superimposed on an actual landscape of the survey site imaged by the imaging unit 28 (FIG. 12A).

With respect to survey points designated on the wire frame WF, for example, survey points b1 and b2 (FIG. 12A) designated on floor levels of the first and second floors of the building, the worker performs a survey of actual points at the survey site corresponding to the respective survey points by using the wire frame WF displayed on the display 27 as a guide.

Specifically, in Step S301, the worker searches for an actual landform point crossing a line segment connecting the survey points b1 and b2 on the wire frame WF in the vertical direction on the display 27 of the wearable device 2, and recognizes this point as a measurement point B1 and sets the target T (FIG. 12B). When the worker issues a measurement instruction (S302), the distance-measuring module 29 measures a linear distance L, the position sensor 26 acquires position information, the posture sensors 24 and 25 acquire posture information, and the disposition relationship is acquired from the storage unit 23 (S303 to S306), and three-dimensional coordinates (absolute coordinates) of the measurement point B1 are calculated (S307). The difference calculating unit 322 grasps coordinates of the measurement point B1 in the space of the CAD, calculates a difference Z1 (FIG. 12B) between the survey point b1 and the actual point (measurement point B1) in the Z direction in the space of the CAD, and calculates a difference Z2 (FIG. 12B) between the survey point b2 and the actual point (measurement point B1) in the Z direction in the space of the CAD (S308). The difference calculating unit 322 can calculate not only the difference in the Z direction in the space of the CAD but also differences in X and Y directions in the space of the CAD.

Last, the difference calculating unit 322 stores coordinates of the measurement point and difference values in the storage unit 33 (S309). The storage site is not limited to the storage unit 33. The three-dimensional coordinates and differences may be recorded in the storage unit 23 of the wearable device 2, or in a management device or management server with which a communication can be made through the communication unit 31.

Effect

As described above, according to the present embodiment, differences between design coordinates and actual coordinates can be easily measured by using the surveying device 100. For investigation to measure differences between design coordinates and actual coordinates, a surveying instrument (total station) is used in many cases, however, with the surveying device 100 of the present embodiment, the investigation can be more easily performed than with the surveying instrument.

4. Modifications

The embodiments described above can be preferably modified, for example, as follows.

4-1. Wearable Device

In all of the embodiments described above, the wearable device 2 is described as a video see-through system that displays an image imaged by the imaging unit 28. In the third embodiment, the video see-through system is preferable for display of a wire frame WF, however, in the first and second embodiments, display of a wire frame WF is optional, so that the imaging unit 28 may be omitted and the display 27 may be a projector type, or a configuration in which the display 27 is omitted and the worker can directly view an actual landscape is also possible.

4-2. Operation Unit

In all of the embodiments described above, the "operation unit" is included in the operation device 3, and the operation device 3 is described as a controller independent from the wearable device 2, however, the "operation unit" may be included in the wearable device 2 (for example, attached as a physical switch to a temple portion of the wearable device 2).

4-3. Arithmetic Unit

In all of the embodiments described above, the "arithmetic unit" that surveys three-dimensional coordinates of a measurement point is described as being performed by the control unit 22 of the wearable device 2, however, it is not limited to this, and the "arithmetic unit" may be realized by the control unit 32 of the operation device 3, or by a processing unit of a management device or a processing unit of a management server with which a communication can be made.

4-4. Disposition Storage Unit

In all of the embodiments described above, the "disposition storage unit" that stores a disposition relationship between the distance-measuring unit and the position sensor is described as the storage unit 23 of the wearable device 2, however, it is not limited to this, and the "disposition storage unit" may be the storage unit 33 of the operation device 3, or the disposition relationship may be stored in a storage unit of a management device or a storage unit of a management server with which the surveying device 1 can communicate, and acquired by communication at the time of a survey.

4-5. Design Data Storage Unit

In the third embodiment, the "design data storage unit" that stores the CAD design data 331 is described as the storage unit 33 of the operation device 3, however, it is not limited to this, the "design data storage unit" may be the storage unit 23 of the wearable device 2, or the CAD design data may be stored in a storage unit of a management device or a storage unit of a management server with which communication can be made, and its necessary portions may be acquired by communication at the time of a survey.

4-6. Others

It is also possible that the wearable device 2 is provided with a CCD or CMOS sensor (line-of-sight sensor) capable of imaging the eyeball of a worker, and configured to detect a line-of-sight direction of the worker based on a disposition relationship between an inner corner position of the eye and an iris position, calculate coordinates of a line-of-sight position of the worker on the display 27, recognize the line-of-sight position of the worker as a target position, and issue a measurement instruction according to the number of blinks of the worker, etc. Accordingly, the worker can use his/her hands freely, and can more easily perform a survey.

As described above, embodiments and modifications of the surveying device have been described, and besides these, the respective embodiments and the respective modifications can be combined based on the knowledge of a person skilled in the art, and such a combined embodiment is also included in the scope of the present invention.

REFERENCE SIGNS LIST

1, 10, 100 Surveying device
2 Wearable device
21 Communication unit
22 Control unit (arithmetic unit)
23 Storage unit (disposition storage unit)
24 Accelerometer (posture sensor)
25 Gyro sensor (posture sensor)
26 GPS device (position sensor)
27 Display
28 Imaging unit
29 Distance-measuring module (distance-measuring unit)
29' Distance-measuring light
291 Surveying first imaging unit (distance-measuring unit)
292 Surveying second imaging unit (distance-measuring unit)
3 Operation device
31 Communication unit
32 Control unit
321 Synchronizing unit
322 Difference calculating unit
33 Storage unit (design data storage unit)
34 Operation unit

The invention claimed is:

1. A surveying device comprising:
a wearable device to be worn on the head of a worker, including a posture sensor configured to detect a posture of the device in three-axis directions of an x-axis set in a line-of-sight direction of the worker, a y-axis set in a left-right direction of the worker, and a z-axis set in an up-down direction of the worker, a distance-measuring unit configured to measure a linear distance from a distance measuring start point to a measurement point by emitting distance-measuring light in the x-axis direction or imaging in the x-axis direction from two different points, and a position sensor having a fixed disposition relationship with the distance-measuring unit based on the three-axis directions and configured to detect a position of the device;
an operation unit configured to issue a measurement instruction to the wearable device;
a disposition storage unit configured to store the disposition relationship; and
an arithmetic unit configured to, upon receiving the measurement instruction, measure the linear distance by the distance-measuring unit, acquire position information of the position sensor, posture information of the posture sensor, and the disposition relationship, calculate coordinates of the distance measuring start point of the distance-measuring unit by moving coordinates acquired by the position sensor in the three-axis directions based on the disposition relationship, and recognize and perform a survey of coordinates moved by the linear distance in the x-axis direction from the coordinates of the distance measuring start point as coordinates of the measurement point.

2. The surveying device according to claim 1, further comprising:
a display capable of being viewed by the worker; and a design data storage unit configured to store CAD design data including a wire frame of an object to be constructed at a survey site of the worker, wherein
the arithmetic unit synchronizes a space of the CAD design data and a space of the wearable device, displays the wire frame viewed from a position and a posture of the wearable device on the display so that the wire frame is superimposed on an actual landscape of the survey site,
surveys an actual point at the survey site corresponding to a survey point designated on the wire frame as the measurement point, and calculates coordinate differences between the survey point and the measurement point.

3. A surveying method using a wearable device to be worn on the head of a worker, including a posture sensor configured to detect a posture of the device in three-axis directions of an x-axis set in a line-of-sight direction of the worker, a y-axis set in a left-right direction of the worker, and a z-axis set in an up-down direction of the worker, a distance-measuring unit configured to measure a linear distance from a distance measuring start point to a measurement point by emitting distance-measuring light in the x-axis direction or imaging in the x-axis direction from two different points, and a position sensor having a fixed disposition relationship with the distance-measuring unit based on the three-axis directions and configured to detect a position of the device, comprising:

(a) a step of measuring the linear distance by the distance-measuring unit;
(b) a step of acquiring position information of the wearable device from the position sensor;
(c) a step of acquiring posture information in the three-axis directions of the wearable device from the posture sensor;
(d) a step of acquiring the disposition relationship between the distance-measuring unit and the position sensor; and
(e) a step of calculating coordinates of the distance measuring start point of the distance-measuring unit by moving coordinates acquired by the position sensor in the three-axis directions based on the disposition relationship, and recognizing and performing a survey of coordinates moved by the linear distance in the x-axis direction from the coordinates of the distance measuring start point as coordinates of the measurement point.

4. The surveying method according to claim 3, wherein the wearable device includes a display capable of being viewed by the worker, and
the surveying method further comprising;
before the step (a), a step of acquiring CAD design data including a wire frame of an object to be constructed at a survey site of the worker, and displaying the wire frame viewed from a position and a posture of the wearable device on the display so that the wire frame is superimposed on an actual landscape of the survey site, and
in the step (e), a step of surveying an actual point at the survey site corresponding to a survey point designated on the wire frame as the measurement point, and calculating coordinate differences between the survey point and the measurement point.

5. A storage medium storing a computer program of the surveying method according to claim 4.

6. A storage medium storing a computer program of the surveying method according to claim 3.

* * * * *